United States Patent
Hsieh et al.

(10) Patent No.: US 9,658,250 B2
(45) Date of Patent: May 23, 2017

(54) VERTICAL PROBE DEVICE HAVING POSITIONING FILM

(71) Applicant: MPI CORPORATION, Chu-Pei, Hsinchu Shien (TW)

(72) Inventors: Hsiang-Sheng Hsieh, Chu-Pei (TW); Sang-Yi Lin, Chu-Pei (TW); Chih-Hao Hsu, Chu-Pei (TW)

(73) Assignee: MPI CORPORATION, Chu-Pei, Hsinchu Shien (TW)

( * ) Notice: Subject to any disclaimer, the term of this patent is extended or adjusted under 35 U.S.C. 154(b) by 0 days.

(21) Appl. No.: 14/978,555

(22) Filed: Dec. 22, 2015

(65) Prior Publication Data

US 2016/0187384 A1  Jun. 30, 2016

(30) Foreign Application Priority Data

Dec. 24, 2014 (TW) .............................. 103145353 A

(51) Int. Cl.
*G01R 31/00* (2006.01)
*G01R 1/067* (2006.01)
*G01R 1/073* (2006.01)

(52) U.S. Cl.
CPC ..... *G01R 1/07371* (2013.01); *G01R 1/07357* (2013.01)

(58) Field of Classification Search
CPC ............ G01R 1/07314; G01R 1/07364; G01R 1/07371; G01R 1/07357; G01R 31/2889; G01R 31/2887
See application file for complete search history.

(56) References Cited

U.S. PATENT DOCUMENTS

| 7,554,348 B2* | 6/2009 | Brandorff .......... G01R 1/07357 324/750.16 |
| 7,649,372 B2 | 1/2010 | Rogers et al. |
| 8,933,719 B2* | 1/2015 | Huang ............... G01R 1/07342 257/48 |

FOREIGN PATENT DOCUMENTS

| JP | 2012159368 A | 8/2012 |
| TW | I299790 B | 8/2008 |
| TW | M483427 U | 8/2014 |

* cited by examiner

*Primary Examiner* — Minh N Tang
(74) *Attorney, Agent, or Firm* — Muncy, Geissler, Olds & Lowe, P.C.

(57) ABSTRACT

A vertical probe device includes upper and lower dies having upper and lower installing holes, probe needles, a lower positioning film disposed between the dies and having lower positioning holes, and a dividing film disposed between the lower positioning film and the upper die and having through holes and dividing ribs. The needle tail is individually inserted through a lower installing hole. The needle head is individually inserted through an upper installing hole. Each lower positioning hole is located under at least one dividing rib and capable of accommodating a plurality of needle heads. Each needle head is inserted through a lower positioning hole and a through hole. Therefore, the films are easily installed, free of irregular hole but passable by narrow needle bodies, and facilitate easy and fast installation and less damage to the probe needles that are well positioned, and facilitate easy installation of the upper die.

17 Claims, 17 Drawing Sheets

VERTICAL PROBE DEVICE HAVING POSITIONING FILM

BACKGROUND OF THE INVENTION

1. Field of the Invention

The present invention relates generally to vertical probe devices and more particularly, to a vertical probe device having a positioning film.

2. Description of the Related Art

Taiwan Patent No. M483427 discloses a vertical probe device which includes a probe seat composed of upper, middle and lower dies or upper and lower dies, a positioning film disposed between the upper and lower dies, and a plurality of probe needles. Each probe needle has a needle head penetrating through the upper die and the positioning film, a needle tail penetrating through the lower die, and a curved needle body located in an accommodating space defined between the upper and lower dies.

In the process of assembling the vertical probe device, the positioning film is fixedly disposed above the lower die in advance, then the probe needles are installed in a way that each probe needle penetrates through the positioning film and the lower die in order, and finally the upper die is fixedly disposed above the positioning film. The positioning film has a plurality of positioning holes corresponding in position to probe needle installation holes of the upper die, and the needle head of each probe needle is individually inserted through one of the positioning holes. Therefore, the needle heads can be positioned correspondingly to the probe needle installation holes of the upper die by the positioning film before the installation of the upper die, so that the needle heads will be inserted through the probe needle installation holes of the upper die smoothly while the upper die is installed.

It is obvious that if the size of the positioning holes is close to the size of the needle heads, the positioning film can limit the needle heads in desired positions very well, but the installation of the probe needles will become relatively more difficult, resulting in low efficiency of installing the probe needles and high possibility of deforming the probe needles. Besides, when the probe needle is deformed and needs to be replaced, such positioning film causes difficulty to the replacement of the probe needle, and the probe needle may even hook the positioning film while being removed to cause the positioning film to be lifted and flipped over. However, if the positioning holes are enlarged, the installation of the probe needles may become relatively easier, but the positions of the needle heads cannot be well limited, causing more difficulty to the installation of the upper die. When the upper die is not installed positively and smoothly, the probe needles may be liable to be damaged.

Furthermore, the needle bodies of some probe needles have narrow and long cross sections, such as that disclosed in the aforesaid Taiwan patent; in such condition, the positioning holes of the positioning film should be configured as irregular holes shaped correspondingly to both the needle head and the needle body. For example, the positioning hole may include a rectangular slot and a circular hole overlappingly located in the middle of the rectangular slot, as illustrated in FIG. 2 of Taiwan Patent No. I299790. Alternately, the positioning hole may be shaped as the other differently shaped positioning holes provided in the aforesaid patent. Such positioning film is relatively more difficult in manufacturing, and causes relatively more difficulty to the installation and the replacement of the probe needles.

Japan Patent Publication No. 2012-159368 discloses another vertical probe device, wherein the needle heads are positioned by upper and lower positioning films having the same configuration and piled on one another with an angular orientation difference of 90 degrees therebetween. Each of the positioning films has a plurality of elongated holes parallel to each other. In the process of installation of the probe needles, the needle heads of the probe needles are inserted through the elongated holes of the lower positioning film. After the installation of the probe needles to the lower positioning film is accomplished, the upper positioning film is disposed on the lower positioning film in a way that the needle heads are also inserted through the elongated holes of the upper positioning film, which are perpendicular to the elongated holes of the lower positioning film, and every two elongated holes perpendicular to each other form a square hole for positioning one of the needle heads.

The aforesaid installation of the probe needles can be performed relatively more easily because the probe needles are inserted through the elongated holes. Besides, even though the needle body has narrow and long cross sections, the positioning film without irregular holes can still be penetrated by such needle body. After the installations of the upper and lower positioning films are accomplished, the needle heads are positioned precisely, so that the upper die is easily installed. In practice, however, not all of the square holes formed by the upper and lower positioning films are needed to accommodate the needle heads. Therefore, when the needle heads penetrate through the lower positioning film but not yet penetrate through the upper positioning film, the elongated holes of the lower positioning film may have much unoccupied space. At this time, the needle heads are liable to deviate from the predetermined positions thereof quite distantly. In such condition, the deviating needle heads should be pulled back to the predetermined positions thereof during the installation of the upper positioning film, causing time-consumption to the installation of the upper positioning film.

U.S. Pat. No. 7,649,372 also discloses a vertical probe device having upper and lower positioning films, wherein the lower positioning film has through holes with relatively larger diameter to make the installation of the probe needles therethrough easier, and the upper positioning film has through holes with diameter very close to the external diameter of the needle head for positioning the needle heads. However, when the probe needles are to be crowdedly arranged together, the through holes of the lower positioning film should be arranged very close to each other. In such condition, the installation of the probe needles may become difficult and liable to have mistakes, and a very crowded arrangement of the probe needles is still unattainable.

SUMMARY OF THE INVENTION

The present invention has been accomplished in view of the above-noted circumstances. It is an objective of the present invention to provide a vertical probe device having a positioning film, wherein the positioning film is easily installed, provided without irregular holes but passable by the needle body having narrow and long cross sections, and facilitates the installation of the probe needles, so that the probe needles are less possibly damaged and can be installed quickly. Besides, after the installation of the positioning film, the positions of the probe needles can be limited very well by the positioning film, so that the upper die is easily installed.

To attain the above objective, the present invention provides a vertical probe device which includes a lower die having a plurality of lower installing holes, an upper die having a plurality of upper installing holes, a plurality of probe needles, a lower positioning film disposed between the lower die and the upper die, and a dividing film disposed between the lower positioning film and the upper die. Each of the probe needles has a needle tail individually inserted through one of the lower installing holes, and a needle head individually inserted through one of the upper installing holes. The lower positioning film has a plurality of lower positioning holes. The needle head of each of the probe needles is inserted through one of the lower positioning holes. Each of the lower positioning holes is capable of accommodating a plurality of needle heads. The dividing film has a plurality of through holes and a plurality of dividing ribs. Each of the dividing ribs is located between two of the through holes. Each of the lower positioning holes is located under at least one of the dividing ribs. The needle head of each of the probe needles is inserted through one of the through holes.

As a result, the lower positioning holes are so different in size with the probe needles that the installation of the probe needles is performed easily, so the probe needles are less possibly damaged and can be installed quickly. Besides, even though the needle body has narrow and long cross sections, the lower positioning holes, which need not to be configured having an irregular shape, are still passable by such needle body. In addition, even though each lower positioning hole accommodates only one needle head, the needle head won't deviate from the predetermined position thereof distantly, facilitating the installation of the dividing film. Besides, the dividing film can limit the positions of the needle heads very well, so that the upper die can be installed easily.

Preferably, the lower positioning holes of the lower positioning film are aligned along at least one imaginary straight line; each of the lower positioning holes is capable of accommodating a plurality of needle heads aligned along the imaginary straight line.

Preferably, in the aforesaid vertical probe device, each of the lower positioning holes has an elongated shape to limit the needle heads located therein to be aligned along only one imaginary straight line. In this way, each lower positioning hole causes the needle head, which is located therein and not yet positioned by the dividing film, a relatively smaller displacement between the actual position thereof and the predetermined position thereof, so that the dividing film can be installed relatively more easily and quickly.

Preferably, in the aforesaid vertical probe device, the dividing film is defined as a middle positioning film, and each of the through holes is defined as a middle positioning hole; each of the middle positioning holes and the lower positioning holes is defined with a length in a direction parallel to the at least one imaginary straight line, and the length of each of the middle positioning holes is smaller than or equal to the length of each of the lower positioning holes. More preferably, the needle head of each of the probe needles is provided at a top thereof with two chamferings. In this way, during the installation of the upper die, the needle head of each of the probe needles can be inserted into the upper installing hole relatively more easily.

Preferably, the aforesaid vertical probe device further includes an upper positioning film having a plurality of upper positioning holes. The middle positioning film is disposed between the upper positioning film and the lower positioning film. The needle head of each of the probe needles is inserted through one of the upper positioning holes. Each of the upper positioning holes is capable of accommodating only one needle head. In this way, the needle heads located in the same lower positioning hole can be divided from each other by the middle positioning film before the installation of the upper positioning film, and then the upper positioning film further limits the positions of the needle heads and lets each needle head approach the predetermined position thereof, resulting in relatively easier and faster installation of the upper die.

Preferably, in the aforesaid vertical probe device, at least one or more middle positioning holes have an elongated shape; each of the elongated middle positioning holes is capable of accommodating a plurality of needle heads and limiting the needle heads located therein to be aligned in only one line. In this way, the middle positioning film can be installed easily and causes the needle head, which is not yet positioned by the upper positioning film, a relatively smaller displacement between the actual position thereof and the predetermined position thereof.

Preferably, in the aforesaid vertical probe device, each of the lower positioning holes has an elongated shape to limit the needle heads located therein to be aligned along only one imaginary straight line; at least one or more of the middle positioning holes are identical in shape and direction of alignment to the lower positioning holes and staggered in position with the lower positioning holes. In this way, the middle positioning film can be designed easily, which can even have the same configuration with the lower positioning film, as long as the middle and lower positioning films are disposed in a stagger manner.

Preferably, in the aforesaid vertical probe device, each of the lower positioning holes is divided into two single-probe-needle holes by one of the dividing ribs of the middle positioning film; each of the single-probe-needle holes is capable of accommodating only one needle head. In other words, each lower positioning hole accommodates at most two needle heads. Even though the needle head deviates from the predetermined position thereof, the needle head is still near the predetermined position thereof, so the middle positioning film can be installed relatively more easily.

Preferably, in the aforesaid vertical probe device, each of the single-probe-needle holes and the upper installing holes is defined with a length in a direction parallel to the at least one imaginary straight line, and the length of each of the single-probe-needle holes is larger than the length of each of the upper installing holes. In this way, each middle positioning hole is so long that each single-probe-needle hole is at least a little larger than the needle head, and such middle positioning film can be installed relatively more easily.

Preferably, in the aforesaid vertical probe device, the dividing film is defined as an upper positioning film, and each of the through holes is defined as an upper positioning hole capable of accommodating only one needle head.

Preferably, in the aforesaid vertical probe device, each of the upper positioning holes is substantially equal in size to each of the upper installing holes or smaller than each of the upper installing holes. In this way, the upper positioning film can limit the positions of the needle heads relatively better, resulting in relatively easier installation of the upper die.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

Figure 1:
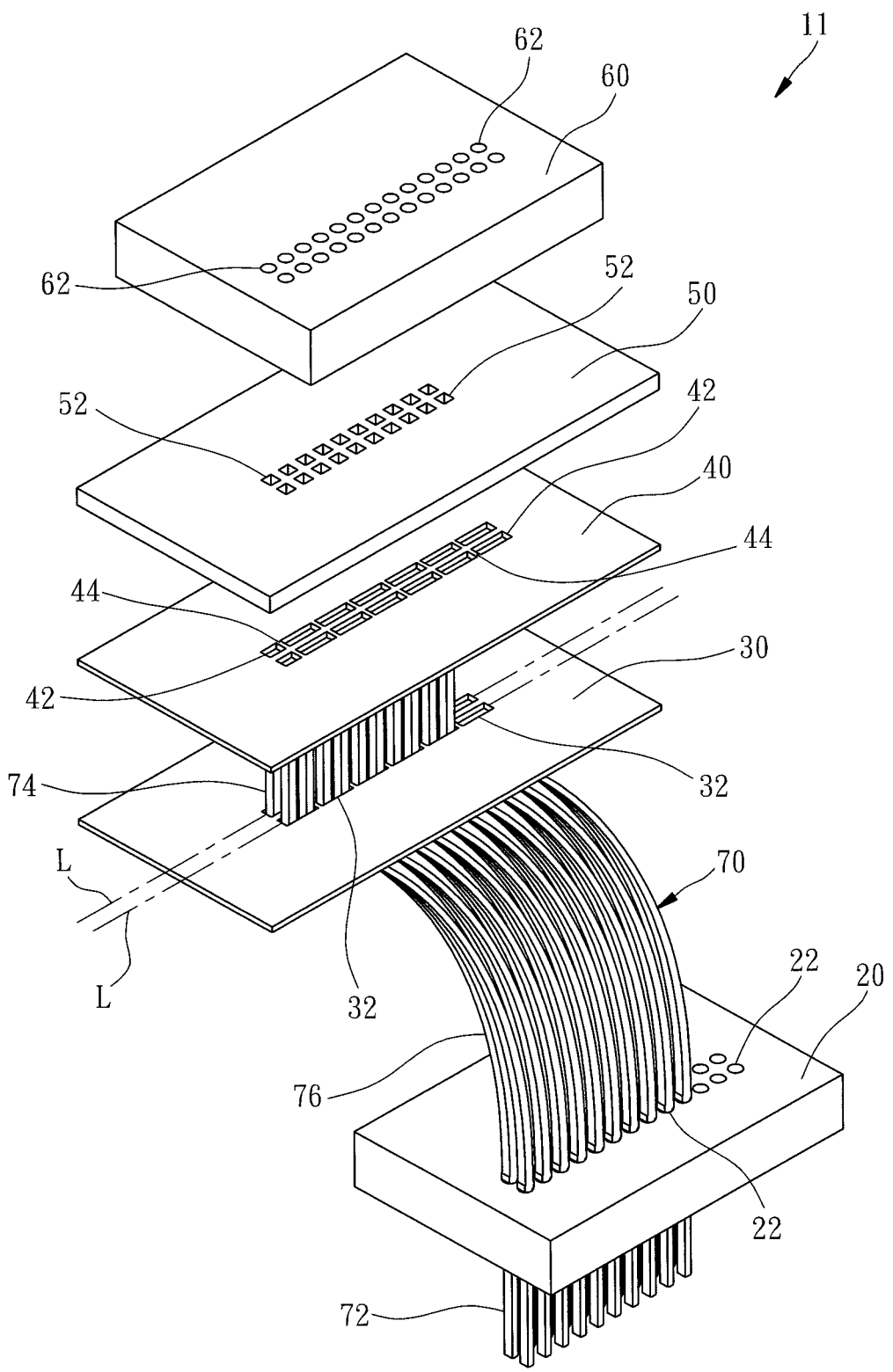
FIG. 1 is an exploded perspective view of a vertical probe device having positioning films according to a first preferred embodiment of the present invention.

First of all, it is to be mentioned that same reference numerals used in the following preferred embodiments and the appendix drawings designate same or similar elements throughout the specification for the purpose of concise illustration of the present invention. Besides, when it is mentioned that an element is mounted on another element, it means that the former element is directly mounted on the latter element, or the former element is indirectly mounted on the latter element through one or more other elements between aforesaid former and latter elements.

Figure 2:
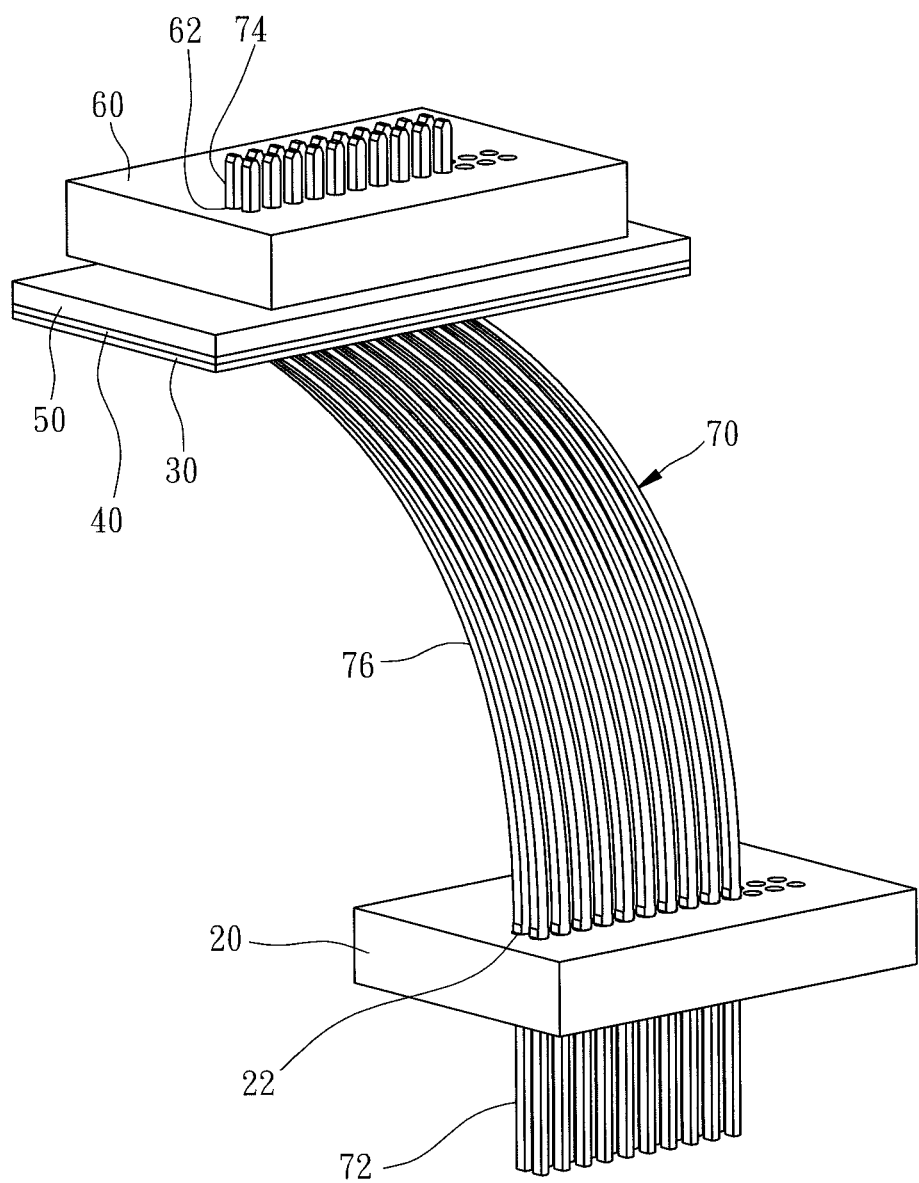
FIG. 2 is an assembled perspective view of the vertical probe device having the positioning films according to the first preferred embodiment of the present invention.

Referring to FIGS. 1-2, a vertical probe device 11 according to a first preferred embodiment of the present invention includes a lower die 20, a lower positioning film 30, a middle positioning film 40, an upper positioning film 50 and an upper die 60, which are arranged from the bottom to the top of the device 11 in order, and a plurality of probe needles 70 penetrating through the aforesaid dies 20, 60 and positioning films 30, 40, 50. In practice, the device 11 further includes a connecting structure disposed between the upper die 60 and the lower die 20 for mounting the positioning films 30, 40, 50 thereon. Since the connecting structure is less related to the technical features of the present invention, the connecting structure is not specified here and not shown in the figures for the convenience of illustration.

Each of the probe needles 70 is a conventional vertical probe needle having a needle tail 72 and a needle head 74, which both have square cross sections, and a needle body 76 connecting the needle tail 72 and the needle head 74. The needle body 76 is gradually increased in area of cross section thereof from an end connected with the needle head 74 to the other end connected with the needle tail 72. The needle tail 72 and the needle head 74 are parallel to each other, and the needle body 76 is curved in a way that the needle tail 72 and the needle head 74 located at two ends of the needle body 76 are not aligned in a line with each other. The probe needle 70 in this embodiment is made by MEMS manufacturing process. However, the probe needle 70 may be the traditional cobra probe needle which also has the feature that the needle body is curved, and the needle tail and the needle head located at two ends of the needle body are not aligned in a line with each other.

In practice, the vertical probe device 11 is a probe head adapted in a probe card. The upper die 60 is adapted to be mounted to the bottom of a space transformer or circuit board, and the needle heads 74 of the probe needles 70 penetrate through the upper die 60 for being stopped at contact pads of the space transformer or circuit board.

The lower die 20 has a plurality of lower installing holes 22, each of which is sized to approximately allow just one single needle tail 72 to pass therethrough. The upper die 60 has a plurality of upper installing holes 62, each of which is sized to approximately allow just one single needle head 74 to pass therethrough. Each of the positioning films 30, 40, 50 is a flexible, insulated thin sheet for the needle heads 74 of the probe needles 70 to penetrate therethrough. With the concurrent cooperation of the positioning films 30, 40, 50, the probe needles 70 are well positioned in desired positions. The details of the aforesaid function will be specified with the assembling process of the vertical probe device 11 in the following contents.

After the aforesaid connecting structure for mounting the positioning films 30, 40, 50 is fixed on the lower die 20, the lower positioning film 30 is mounted on the connecting structure, and then the installation of the probe needles is performed. Specifically speaking, by taking the device shown in FIG. 1 as an instance, the lower positioning film 30 has a plurality of lower positioning holes 32 aligned respectively along two imaginary straight lines L. Along a same imaginary straight line L, there are a plurality of lower positioning holes 32. Each of the lower positioning holes 32 is shaped as a rectangle, and the long sides thereof are parallel to the imaginary straight lines L. Each of the lower positioning holes 32 is capable of accommodating a plurality of needle heads 74 aligned along one of the imaginary straight lines L. In the process of installation of the probe needles, each of the probe needles 70 is inserted through one of the lower positioning holes 32 and one of the lower installing holes 22 in order from the top of the lower positioning film to the bottom of the lower die. Each of the lower positioning holes 32 is so long that the probe needle 70 can be easily inserted therethrough, such that the installation of the probe needles can be performed easily. As a result, the probe needles 70 can be installed quickly and less possibly deformed or damaged. Besides, even though the needle body has narrow and long cross sections, the lower positioning holes 32, which need not to be configured having an irregular shape, are still adapted for such needle body to pass therethrough. It is to be mentioned that the aforesaid sentence that the lower positioning film 30 has a plurality of lower positioning holes 32 aligned along two imaginary straight lines L only describes an example of the lower positioning film for specifying the technical feature of the present invention. In practice, the lower positioning film 30 may have hundreds or thousands of lower positioning holes 32 for the probe needles 70 to be inserted therethrough, and the lower positioning holes 32 may be arranged at specific positions or according to a specific pattern, depending on the actual testing requirement.

Figure 3:
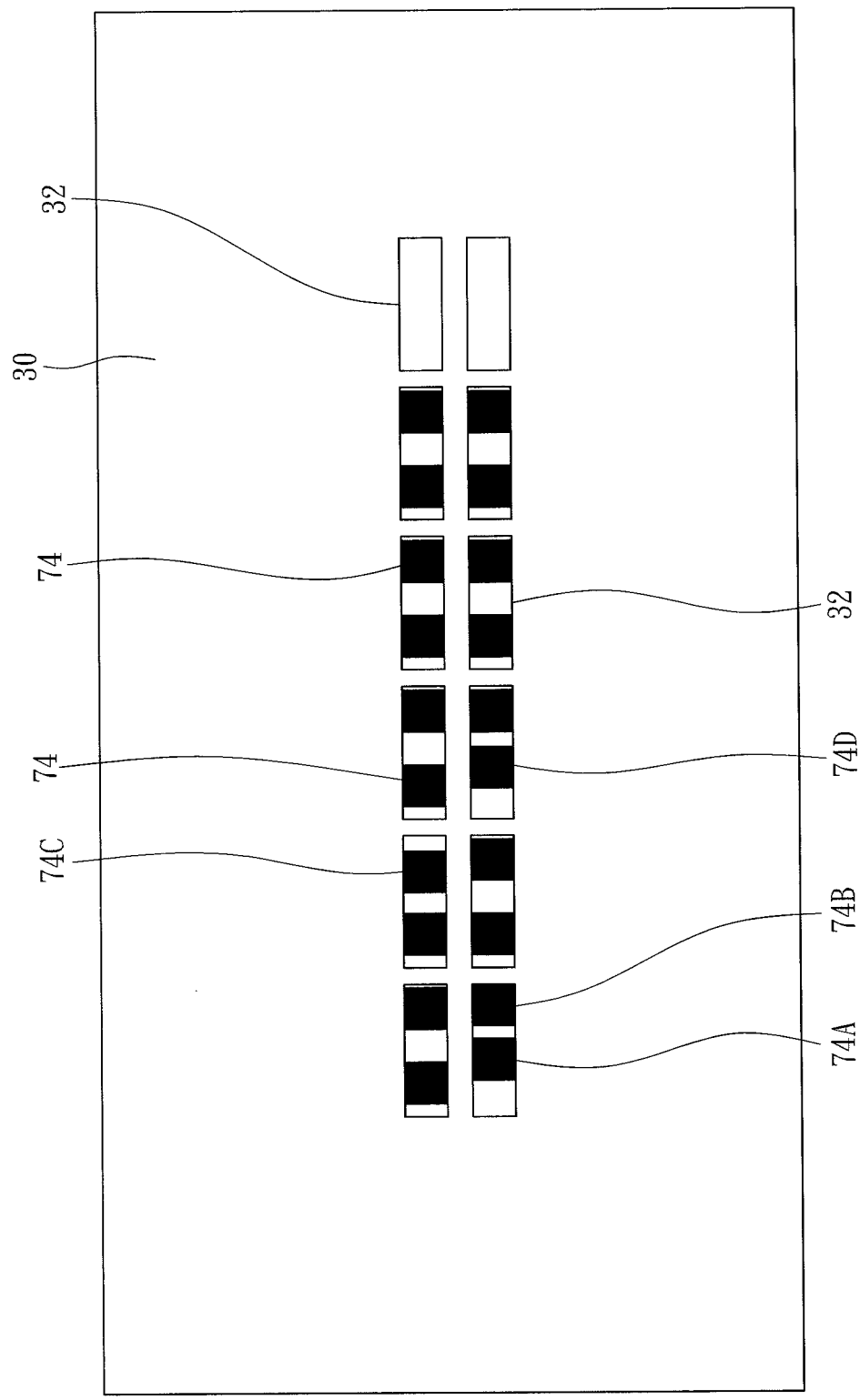
FIG. 3 is a schematic top view of a plurality of probe needles and a lower positioning film of the vertical probe device according to the first preferred embodiment of the present invention, showing the needle heads of the probe needles penetrate through the lower positioning film.

When the installation of the probe needles is accomplished, the needle tail 72 of each of the probe needles 70 is individually inserted through one of the lower installing holes 22, and the needle head 74 of each of the probe needles 70 is inserted through one of the lower positioning holes 32, as shown in FIG. 3. This means, as shown in FIGS. 1-2, each of the lower installing holes 22 may accommodate only one needle tail 72 or may not accommodate any needle tail 72, and as shown in FIG. 3, each of the lower positioning holes 32 may accommodate one or more needle heads 74 or may not accommodate any needle head 74. At this time, each needle head 74 can still move a little bit in the lower positioning hole 32 where it is located; therefore, some needle heads 74 may deviate from the predetermined positions thereof, such as the needle heads 74A-74D which do not correspond in position to the other needle heads 74 shown in FIG. 3. Because there are a plurality of lower positioning holes 32 aligned on the same imaginary straight line L and each lower positioning hole 32 has a limited length capable of accommodating only a few needle heads 74, each needle head 74 can't deviate distantly from the predetermined position thereof. Particularly, in this embodiment the needle heads 74 located in the same lower positioning hole 32 are limited to be aligned along only one imaginary straight line L; this feature further limits the direction and range each needle head 74 can deviate.

Figure 4:
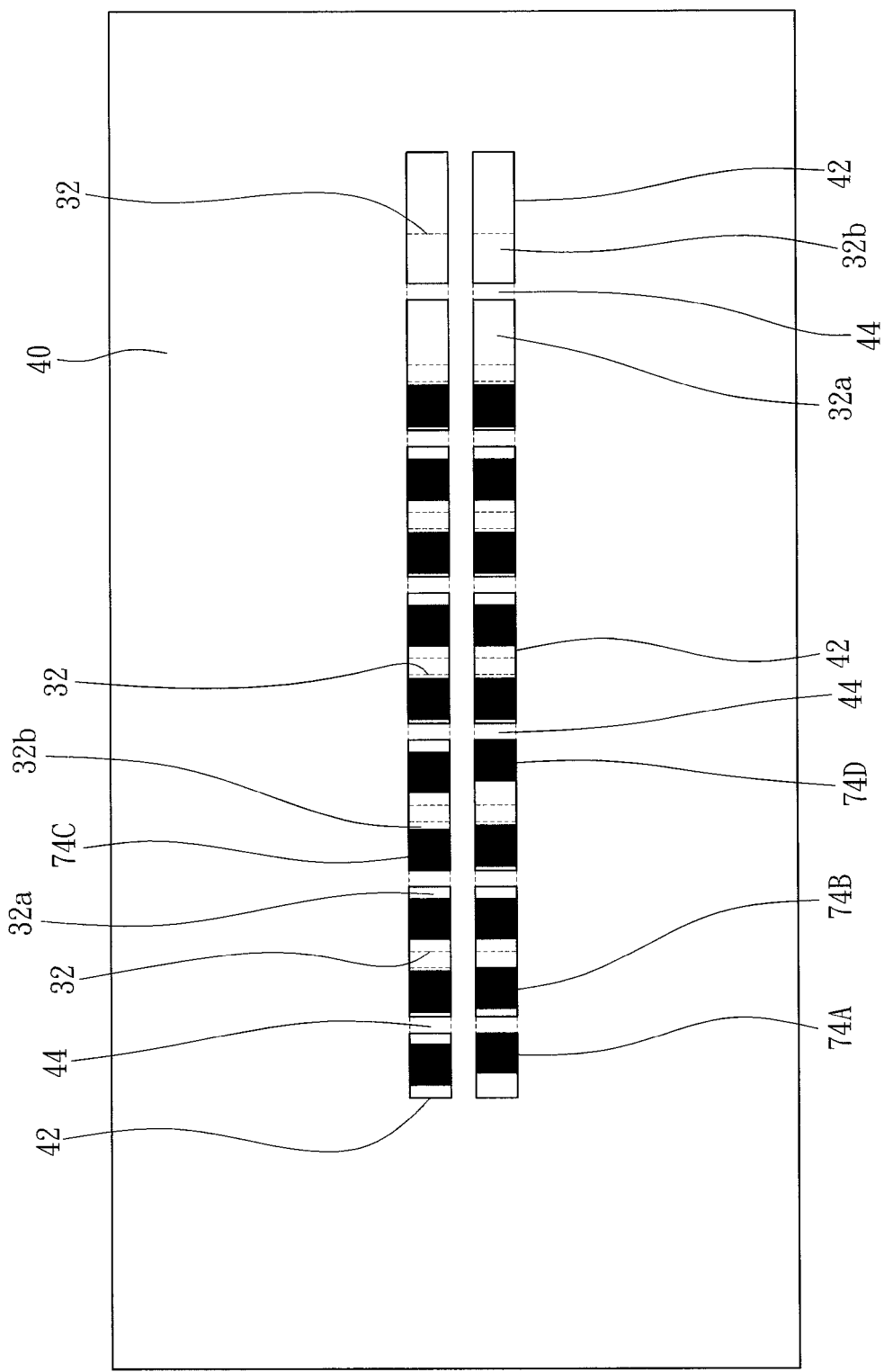
FIG. 4 is a schematic top view similar to FIG. 3, but further showing a middle positioning film disposed on the lower positioning film.

After the installation of the probe needles is accomplished, the next step is to dispose the middle positioning film 40 on the lower positioning film 30. The middle positioning film 40 has a plurality of rectangular middle positioning holes 42, and a plurality of dividing ribs 44. Each of the dividing ribs 44 is located between two of the middle positioning holes 42. When the middle positioning film 40 is located on the lower positioning film 30, each of the lower positioning holes 32 is located under at least one of the dividing ribs 44. For example, each of the lower positioning holes 32 in this embodiment is located under one of the dividing ribs 44, as shown in FIG. 4. The needle head 74 of each of the probe needles 70 is inserted through one of the middle positioning holes 42. In this way, the needle heads 74 located in the same lower positioning hole 32 are divided from each other by the dividing ribs 44 of the middle positioning film 40. Besides, some needle heads 74 are moved a little bit in this step for fitting the positions of the middle positioning holes 42, thereby approaching the predetermined positions thereof. For example, the needle heads 74A and 74D are moved to the left from the position shown in FIG. 3 to the position shown in FIG. 4, and the needle head 74C is moved to the right from the position shown in FIG. 3 to the position shown in FIG. 4. Because each needle head 74 can deviate from the predetermined position thereof for only a short distance before installation of the middle positioning film 40, the step of installing the middle positioning film 40 can be carried out very easy and fast.

In this embodiment, only the leftmost two middle positioning holes 42 in FIG. 4 are shorter than the lower positioning hole 32; specifically speaking, the length of each of the leftmost two middle positioning holes 42 in the direction parallel to the imaginary straight lines L is smaller than the length of each lower positioning hole 32 in the direction parallel to the imaginary straight lines L. The other middle positioning holes 42 are identical in shape and direction of alignment to the lower positioning holes 32 and staggered in position with the lower positioning holes 32. In this way, the middle positioning film 40 can be designed in an easy way that the middle positioning holes 42 are arranged according to the position arrangement of the lower positioning holes 32 but staggered in position with the lower positioning holes 32. Because no probe needle 70 has to be inserted in the rightmost two lower positioning holes 32, the middle positioning film 40 can even have the same configuration with the lower positioning film 30, as long as the middle and lower positioning films 40, 30 are disposed in a stagger manner by displacing the middle positioning film 40 to the left relative to the lower positioning film 30 for a short distance.

In this embodiment, each of the lower positioning holes 32 is divided into two single-probe-needle holes 32a and 32b by one of the dividing ribs 44 of the middle positioning film 40, and each of the single-probe-needle holes 32a and 32b is capable of accommodating only one single needle head 74. In other words, each lower positioning hole 32 accommodates at most two needle heads 74, and only one dividing rib 44 is located above each of the lower positioning holes 32; such configuration design is easiest and most effective. Even though the needle head 74 deviates from the predetermined position thereof before installation of the middle positioning film 40, the needle head 74 is still near the predetermined position thereof, so the middle positioning film 40 can be installed relatively more easily. However, each of the lower positioning holes 32 may be designed to accommodate more than two needle heads 74, and be arranged to be located under a plurality of dividing ribs 44 so as to be divided into more than two single-probe-needle holes. The length of each of the single-probe-needle holes in the direction parallel to the imaginary straight lines L may, but not limited to, be larger than the length of each of the upper installing holes 62 in the direction parallel to the imaginary straight lines L. For example, the length of each of the single-probe-needle holes 32a and 32b in this embodiment is larger than the diameter of each upper installing hole 62. In this way, each middle positioning hole 42 is so long that each single-probe-needle hole is at least a little larger than each needle head 74, and the installation of such middle positioning film 40 can be carried out relatively easier.

After the middle positioning film 40 is disposed on the lower positioning film 30, the upper positioning film 50 is disposed on the middle positioning film 40, and finally the upper die 60 is fixedly disposed above the upper positioning film 50. Specifically speaking, the upper positioning film 50 has a plurality of square upper positioning holes 52 corresponding in position and amount to the upper installing holes 62 of the upper die 60, and each of the upper positioning holes 52 is capable of accommodating only one needle head 74. When the upper positioning film 50 is located on the middle positioning film 40, the needle head 74 of each of the probe needles 70 is inserted through one of the upper positioning holes 52. Each of the upper positioning holes 52 may be designed having a size very close or even equal to the size of the cross sections of the needle head 74, so as to well limit the needle head 74 at a predetermined position. Because each needle head 74 is located very close to the predetermined position thereof before the installation of the upper positioning film 50, this step of installing the upper positioning film 50 can be carried out very easy and fast. In the end, in the process of installation of the upper die 60, each of the needle heads 74 has been positioned by the positioning films 30, 40, 50 so well as to be inserted through one of the upper installing holes 62 very smoothly; therefore, this step of installing the upper die 60 can be carried out very easy and fast, and the probe needles 70 can be prevented from damage during installation of the upper die 60.

Figure 5:
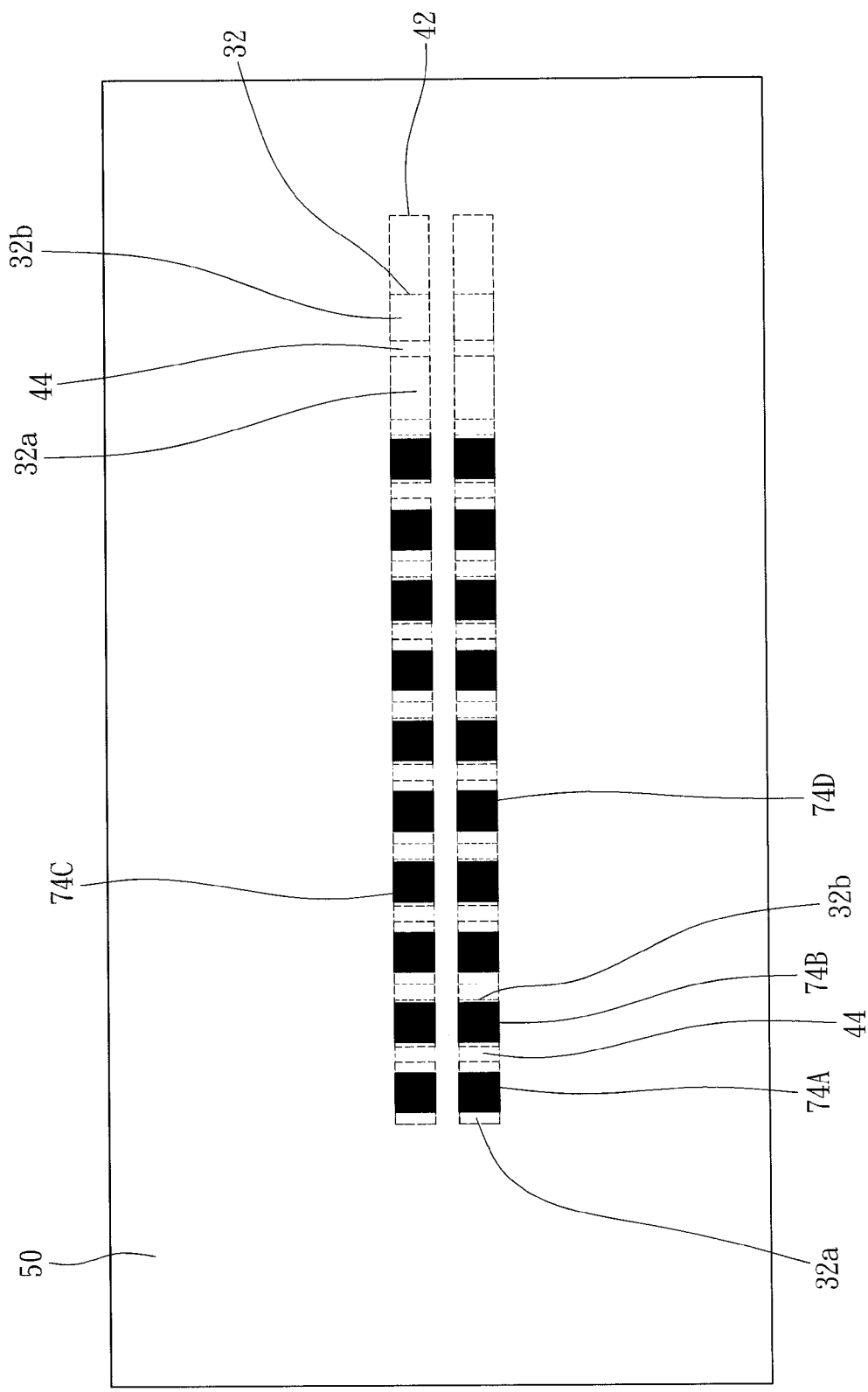
FIG. 5 is a schematic top view similar to FIG. 4, but further showing an upper positioning film disposed on the middle positioning film.

For the relatively easier installation of the upper die 60, each of the upper positioning holes 52 may, but not limited to, be substantially equal in size to each of the upper installing holes 62 or smaller than each of the upper installing holes 62. For example, in this embodiment the size of each upper positioning hole 52 is equal to the size of the cross section of each needle head 74, so the needle heads 74 can be positioned at the predetermined positions thereof precisely by the upper positioning holes 52, as shown in FIG. 5. Besides, in this embodiment each of the upper installing holes 62 is a little larger than each needle head 74 and each upper positioning hole 52; specifically speaking, the diameter of each upper installing hole 62 is a little larger than the length of each side of each upper positioning hole 52. In this way, as long as the needle heads 74 are inserted through the upper positioning holes 52, they are ensured to correspond in position to the upper installing holes 62.

In fact, as long as there is a dividing film disposed on the lower positioning film 30 and having a plurality of through holes for the needle heads 74 to be inserted therethrough and a plurality of dividing ribs to divide the needle heads 74 located in the same lower positioning hole 32 from each other, the primary objective of the present invention can be achieved. In the aforesaid first preferred embodiment, the middle positioning film 40 serves as the dividing film, and the middle positioning holes 42 and the dividing ribs 44 are namely the through holes and the dividing ribs of the dividing film.

Figure 6:
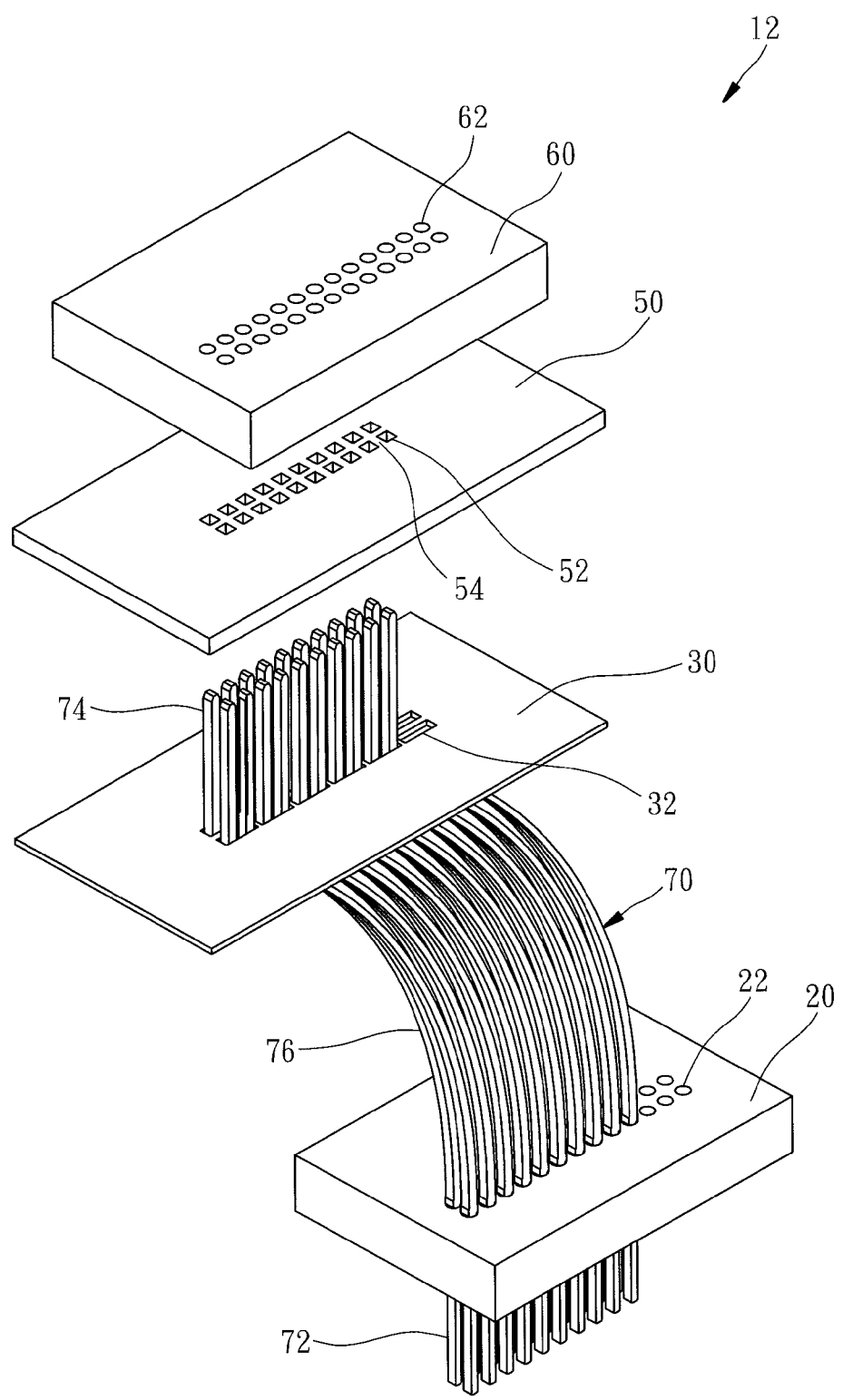
FIG. 6 is an exploded perspective view of a vertical probe device having positioning films according to a second preferred embodiment of the present invention.
Figure 7:
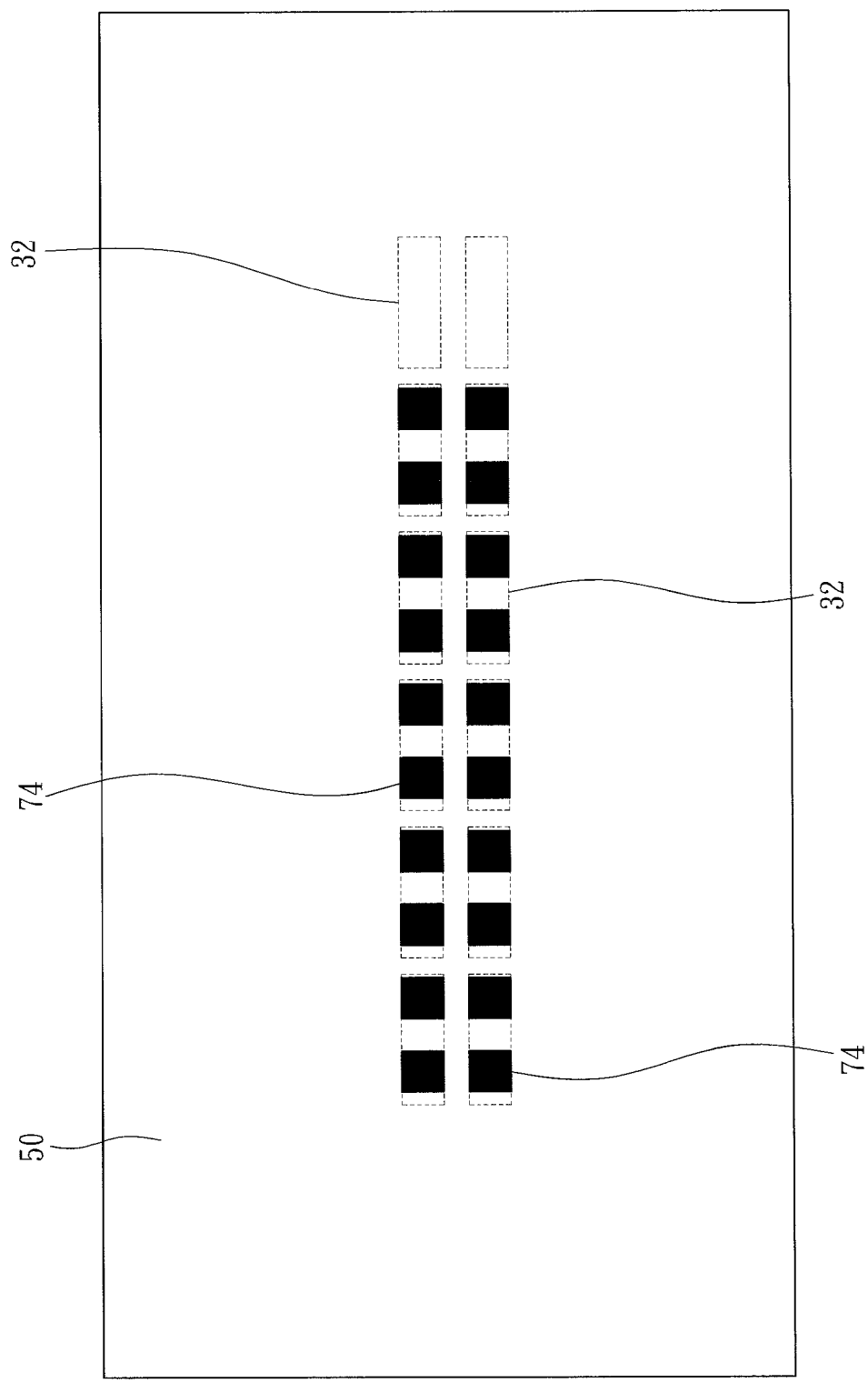
FIG. 7 is a schematic top view of a plurality of probe needles and upper and lower positioning films of the vertical probe device according to the second preferred embodiment of the present invention, showing the needle heads of the probe needles penetrate through the upper and lower positioning films.

The vertical probe device of the present invention may have no such middle positioning film 40 disposed between the lower positioning film 30 and the upper positioning film 50 as above-mentioned. Such vertical probe device 12 according to a second preferred embodiment of the present invention is shown in FIGS. 6-7. In such condition, the upper positioning film 50 serves as the dividing film, the upper positioning holes 52 are namely the through holes of the dividing film, and there is a dividing rib 54 located between every two adjacent upper positioning holes 52 to divide the needle heads 74 located in the same lower positioning hole 32 from each other. As above-mentioned, when each needle head 74 only penetrates through the lower positioning film 30, each lower positioning hole 32 has a limited area to allow the needle head 74 to deviate therein. Therefore, it doesn't consume much time to pull the deviating needle heads 74 back to the predetermined positions thereof while disposing the upper positioning film 50 directly on the lower positioning film 30.

Figure 8:
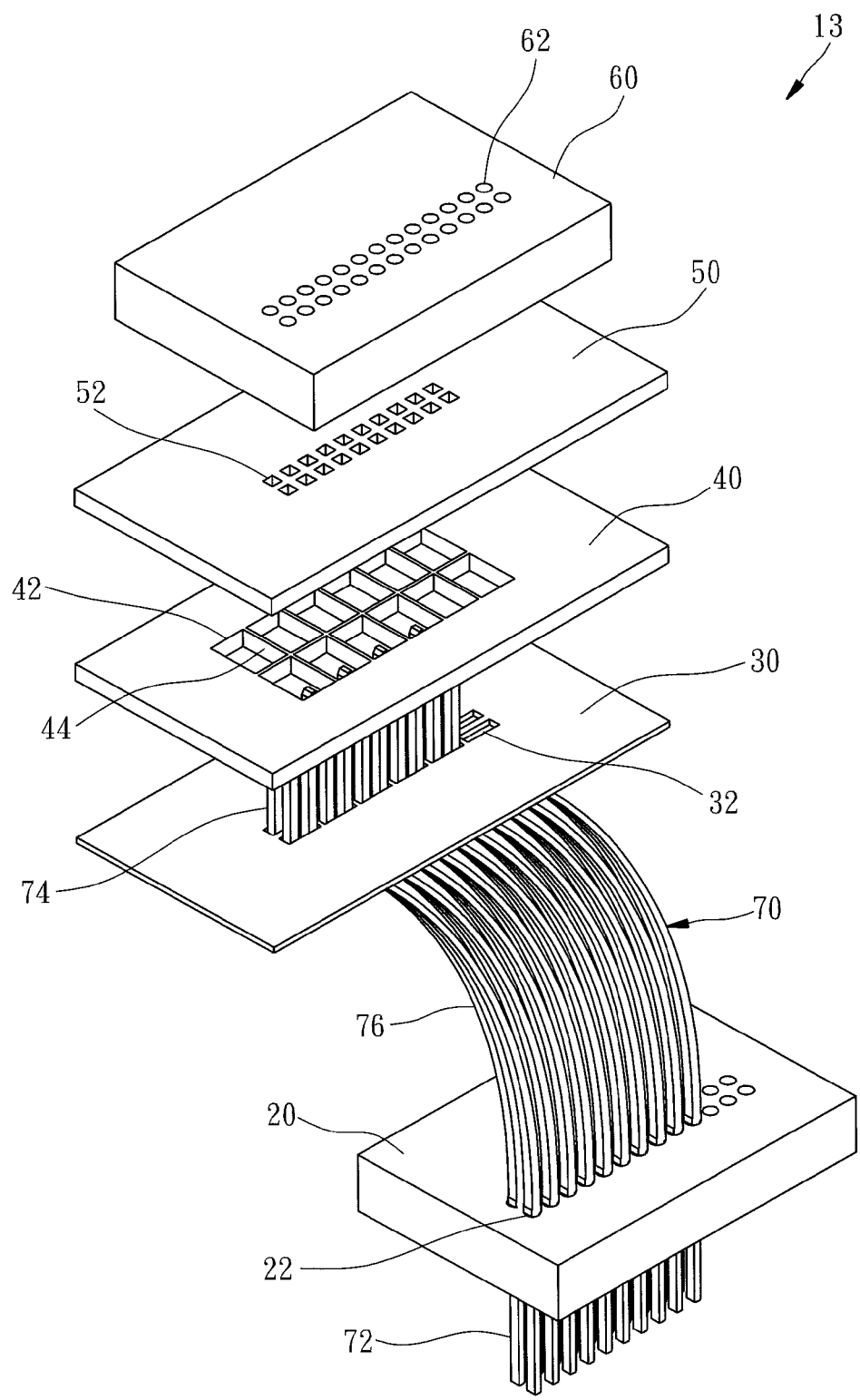
FIG. 8 is an exploded perspective view of a vertical probe device having positioning films according to a third preferred embodiment of the present invention.
Figure 9:
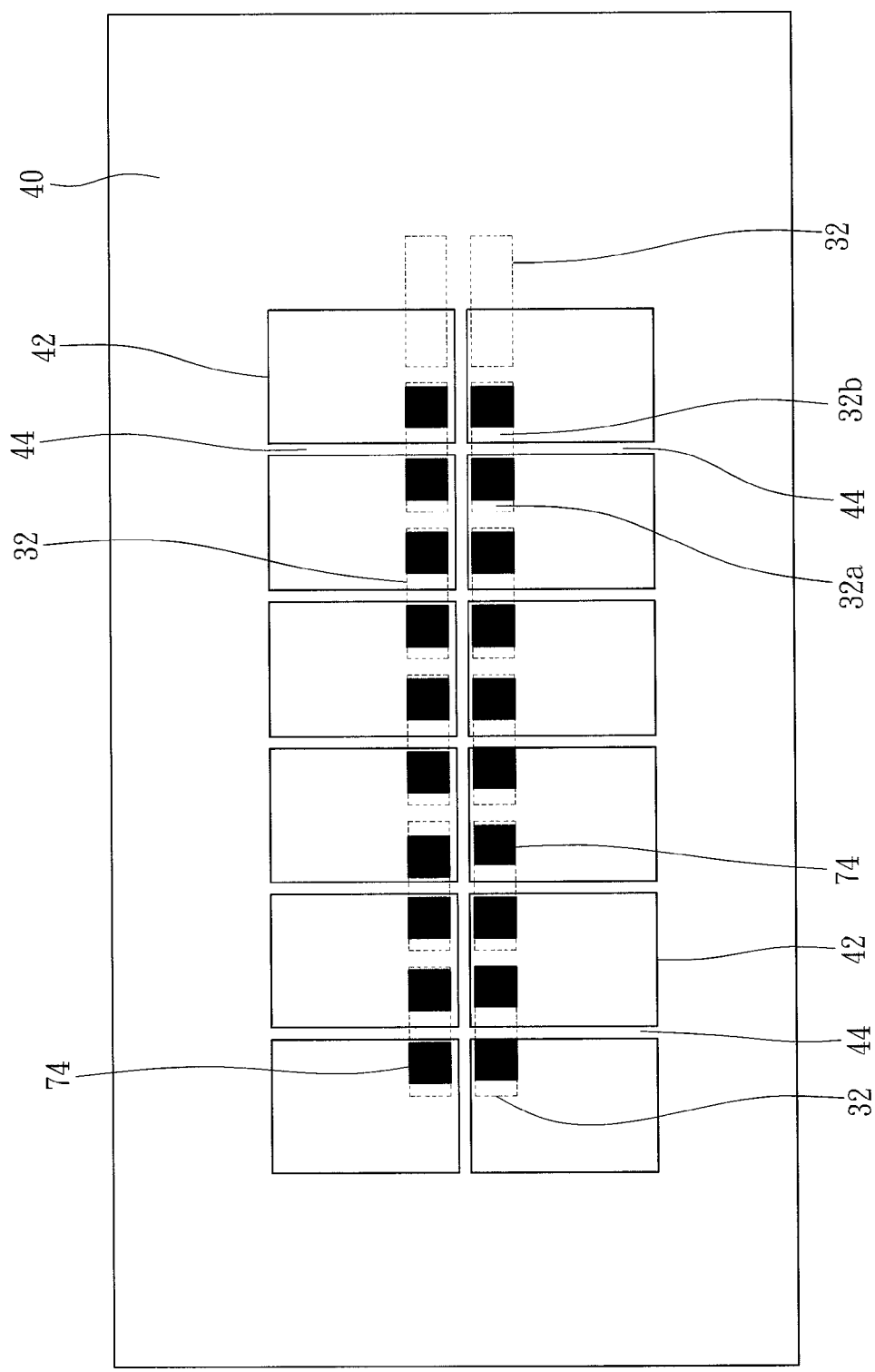
FIG. 9 is a schematic top view of a plurality of probe needles and middle and lower positioning films of the vertical probe device according to the third preferred embodiment of the present invention, showing the needle heads of the probe needles penetrate through the middle and lower positioning films.
Figure 10:
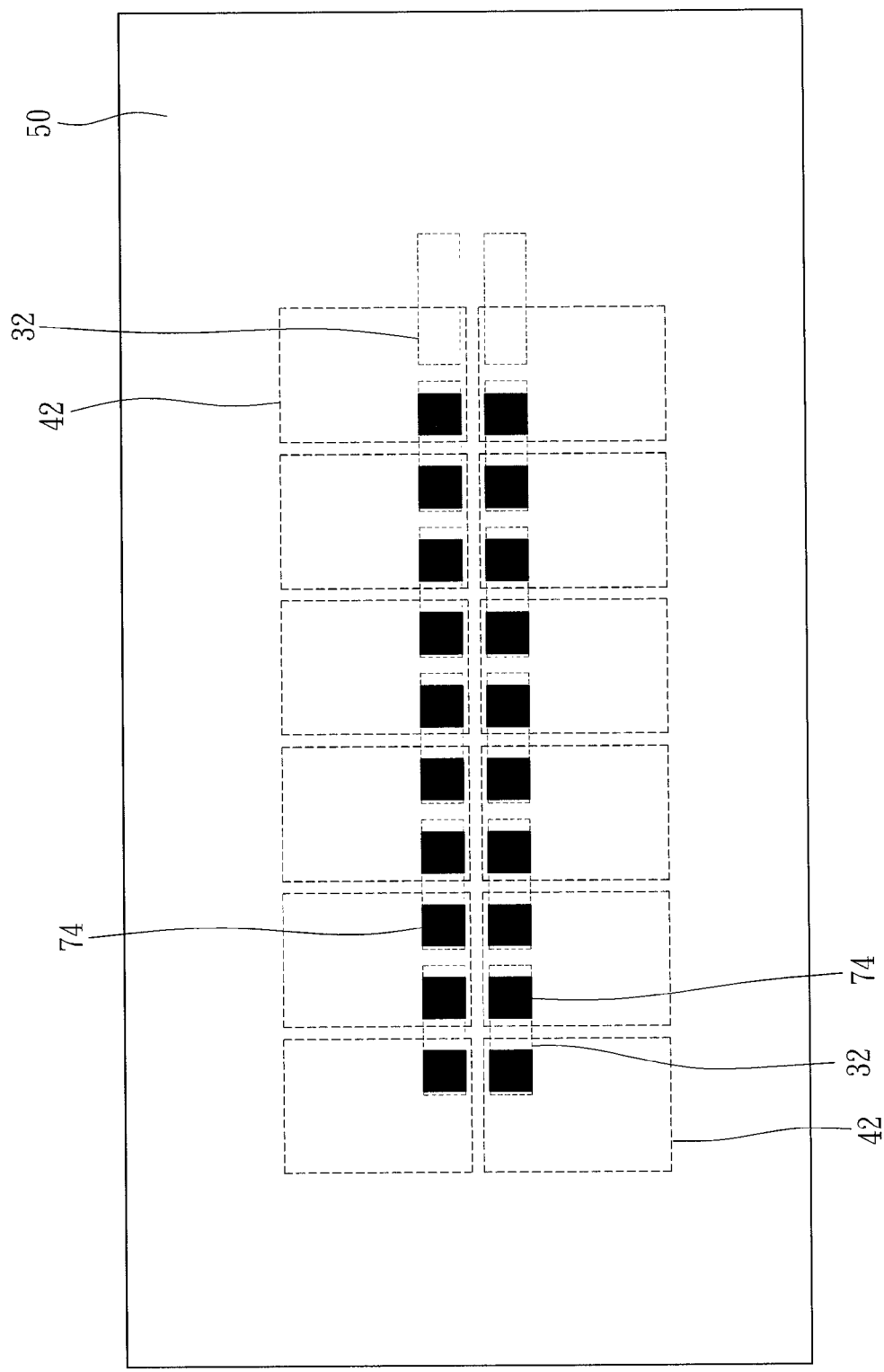
FIG. 10 is a schematic top view similar to FIG. 9, but further showing an upper positioning film disposed on the middle positioning film.
Figure 11:
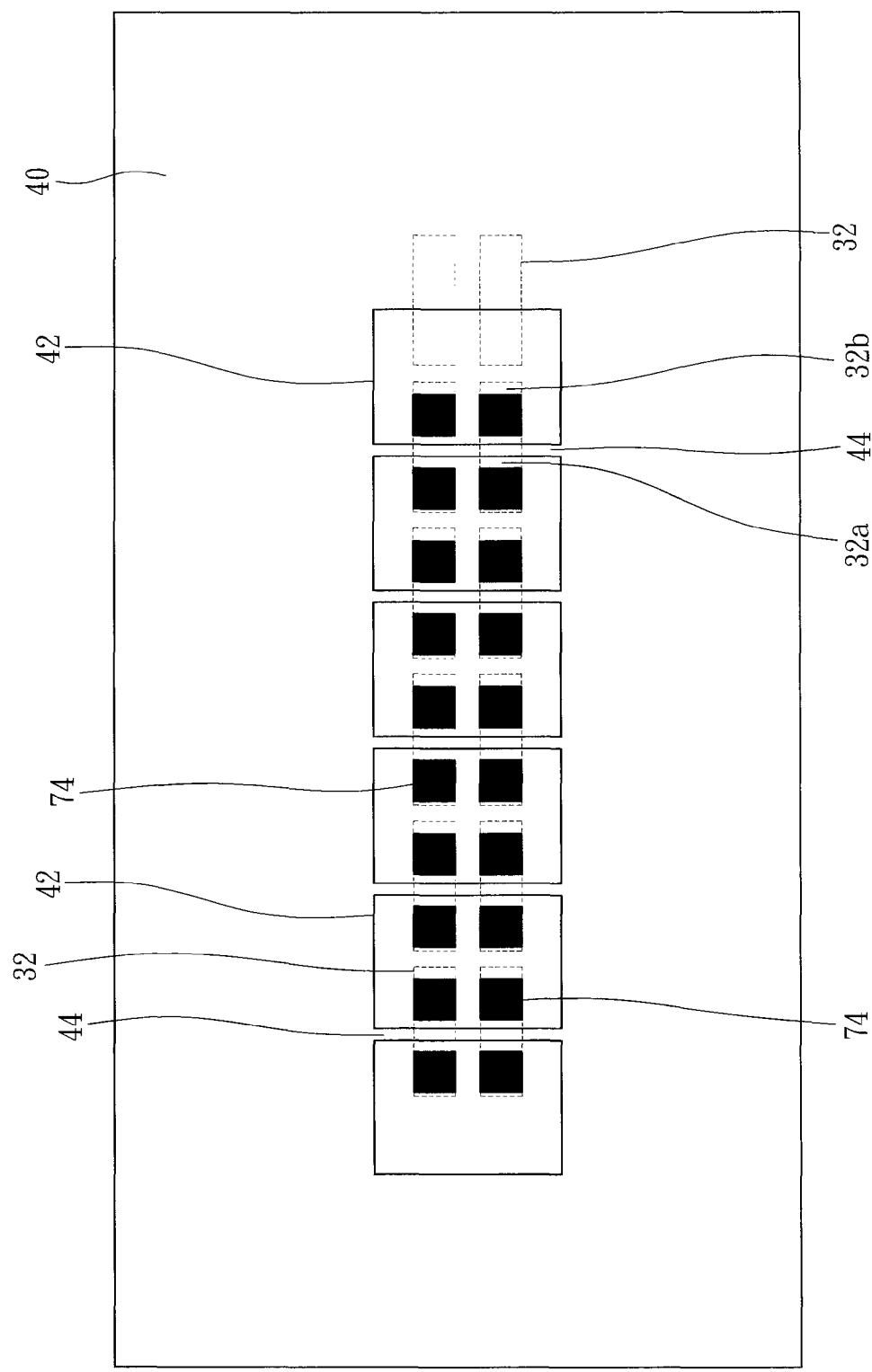
FIG. 11 is a schematic top view of a plurality of probe needles and middle and lower positioning films of a vertical probe device according to a fourth preferred embodiment of the present invention, showing the needle heads of the probe needles penetrate through the middle and lower positioning films.

The middle positioning film 40 in the present invention may not be limited to have at least some of the middle positioning holes 42 be identical in shape and direction of alignment to the lower positioning holes 32 and staggered in position with the lower positioning holes 32, such as the middle positioning film 40 of the vertical probe device 13 provided according to a third preferred embodiment of the present invention as shown in FIGS. 8-10. Further, each of the middle positioning holes 42 of the middle positioning film 40 may even not have an elongated shape and not configured to limit the needle heads 74 located therein to be aligned in only one line, as long as the middle positioning film 40 has the dividing ribs 44 capable of dividing the needle heads 74 located in the same lower positioning hole 32 from each other. Besides, as shown in FIG. 11 illustrating a fourth preferred embodiment of the present invention, one dividing rib 44 may divide a plurality of lower positioning holes 32.

Figure 12:
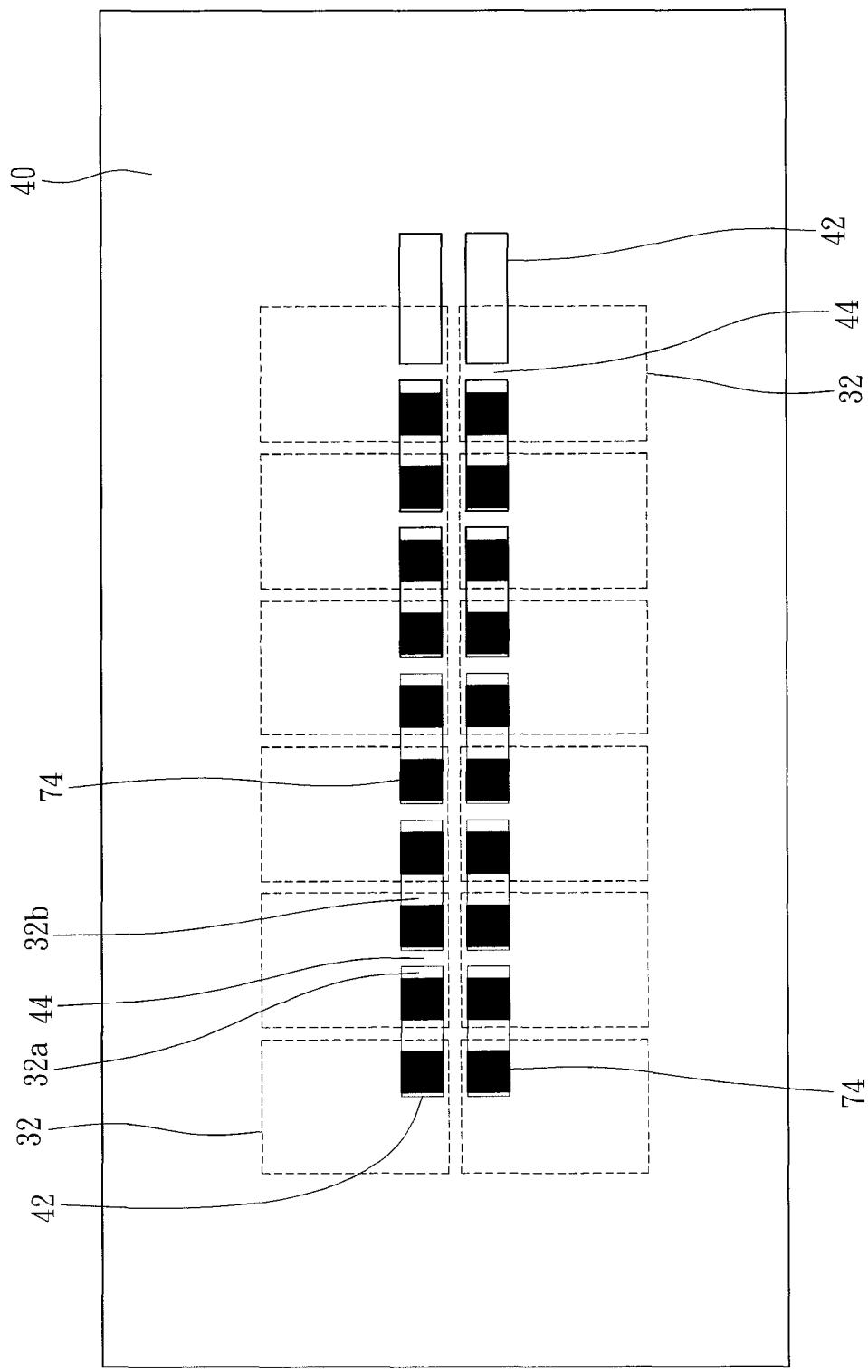
FIG. 12 is a schematic top view of a plurality of probe needles and middle and lower positioning films of a vertical probe device according to a fifth preferred embodiment of the present invention, showing the needle heads of the probe needles penetrate through the middle and lower positioning films.

As shown in FIG. 12 illustrating a fifth preferred embodiment of the present invention, each of the lower positioning holes 32 may be configured not to limit the needle heads 74 located therein to be aligned along one of the imaginary straight lines L, and may not have an elongated shape. In such condition that the needle heads 74 located in each lower positioning hole 32 may not be aligned along one of the imaginary straight lines L, as long as each middle positioning hole 42 is designed having elongated shape to limit the needle heads 74 located therein to be aligned in only one line, each lower positioning hole 32 can be still divided into a plurality of single-probe-needle holes 32a and 32b by the middle positioning film 40, so that the needle heads 74 can also be positioned well.

Figure 13:
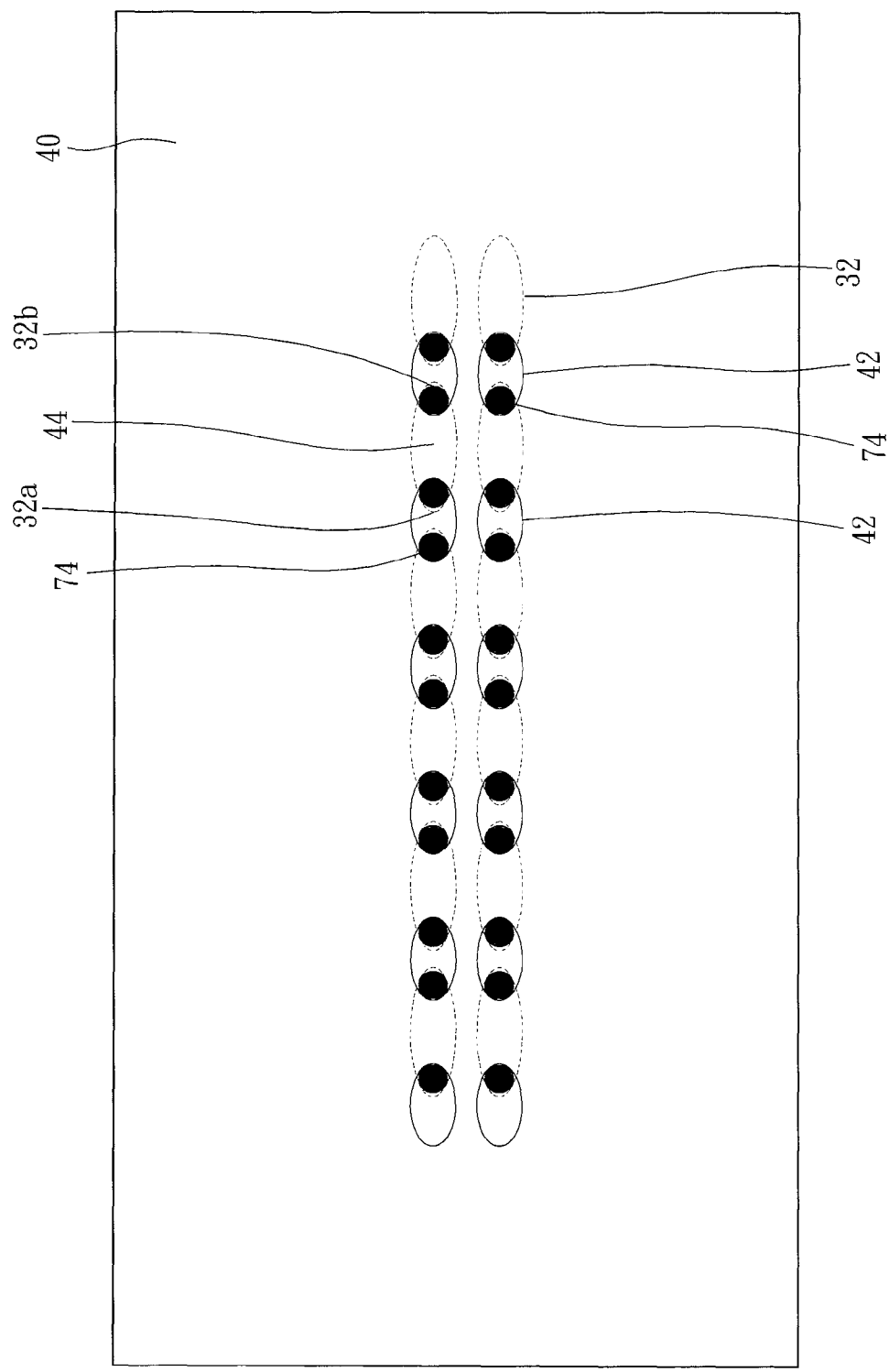
FIG. 13 is a schematic top view of a plurality of probe needles and middle and lower positioning films of a vertical probe device according to a sixth preferred embodiment of the present invention, showing the needle heads of the probe needles penetrate through the middle and lower positioning films.

The aforesaid elongated lower positioning holes 32 and middle positioning holes 42 are not limited to be shaped as rectangles. For example, in a sixth preferred embodiment of the present invention as shown in FIG. 13, the lower positioning holes 32 and the middle positioning holes 42 are shaped as ellipses. The length of each middle positioning hole 42 in the direction parallel to the imaginary lines L is smaller than, or may be equal to, the length of each lower positioning hole 32 in the direction parallel to the imaginary lines L.

Figure 14:
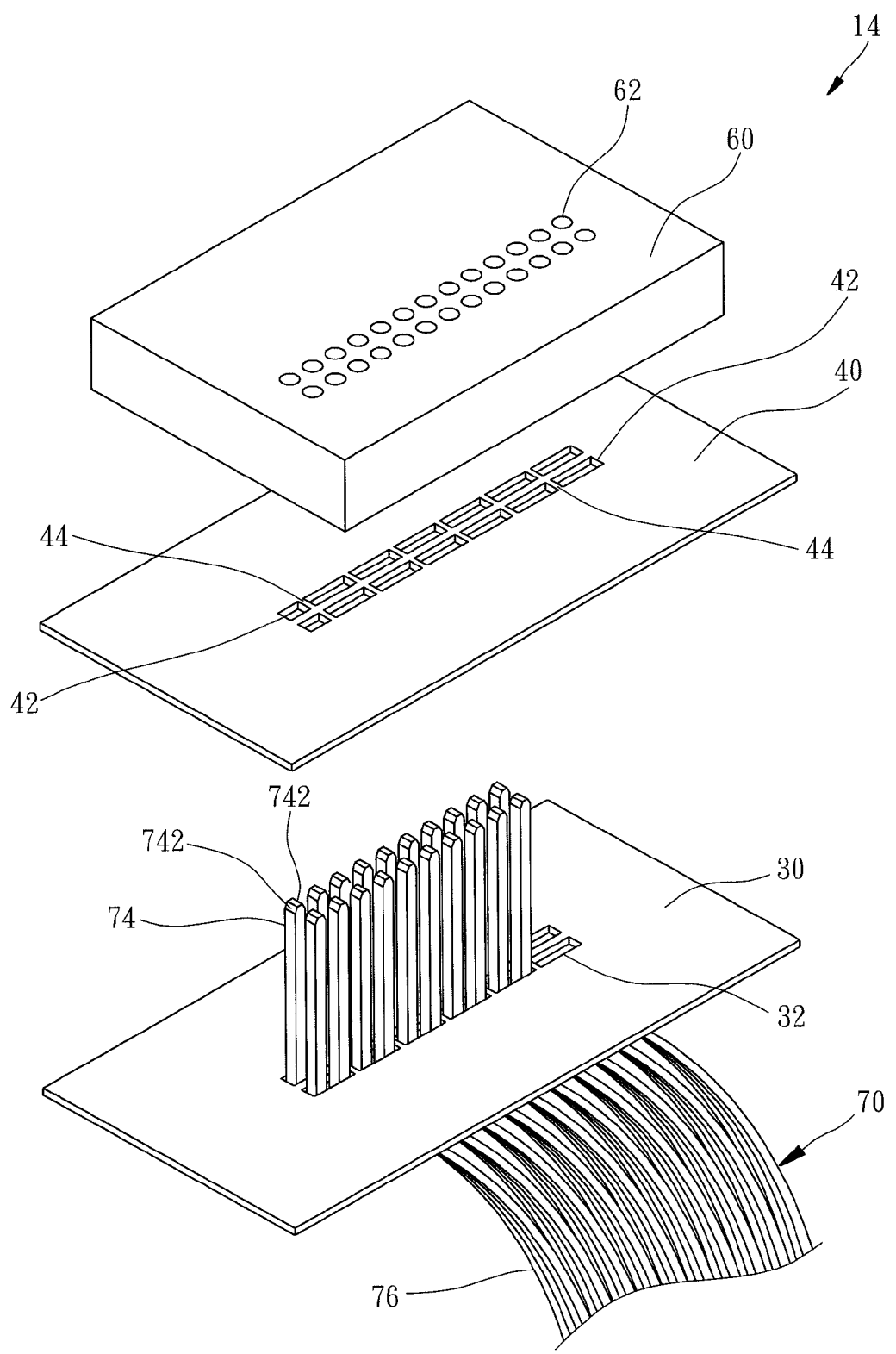
FIG. 14 is an exploded perspective view of a vertical probe device having positioning films according to a seventh preferred embodiment of the present invention.

As above-mentioned, as long as there is a dividing film capable of dividing the needle heads 74 located in the same lower positioning hole 32 from each other, the primary objective of the present invention can be achieved. Therefore, the vertical probe device of the present invention may have no such upper positioning film 50 located between the middle positioning film 40 and the upper die 60. FIG. 14 illustrates a seventh preferred embodiment of the present invention for such a design. In this design, the needle head 74 may deviate from the position corresponding to the upper installing hole 62 of the upper die 60; however, because the needle head 74 of each probe needle 70 is provided at the top thereof with two chamferings 742 which can guide the needle head 74 into the upper installing hole 62 when contacting the upper die 60, the upper die 60 can be easily installed. Besides, when a replacement of probe needle is required, only the upper die 60 has to be removed and the middle positioning film 40 doesn't have to be removed before the probe needle is upwardly pulled out, so that the replacement of probe needle can be performed quickly.

Figure 15:
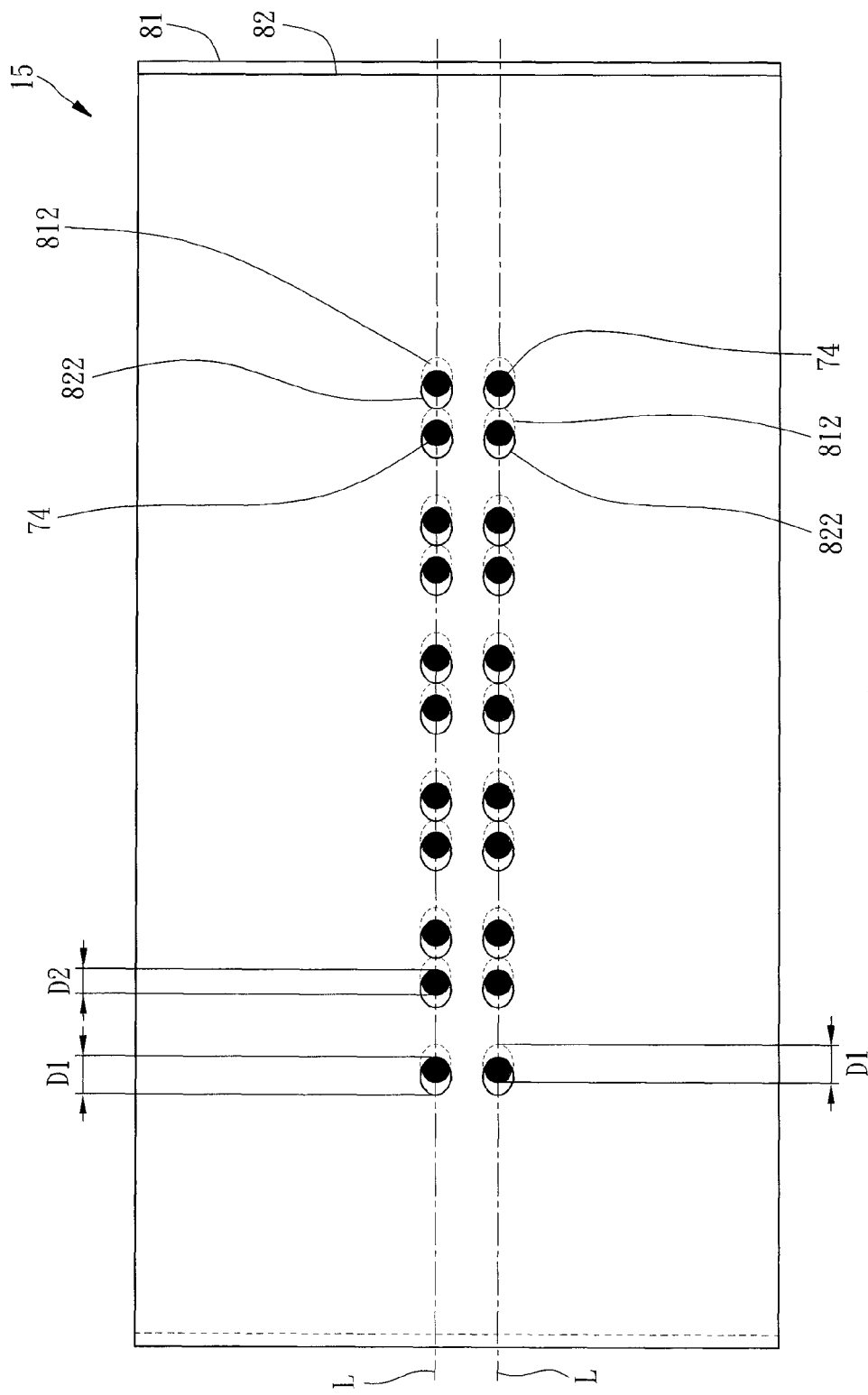
FIG. 15 is a schematic top view of a plurality of probe needles and first and second positioning films of a vertical probe device according to an eighth preferred embodiment of the present invention, showing the needle heads of the probe needles penetrate through the first and second positioning films.
Figure 16:
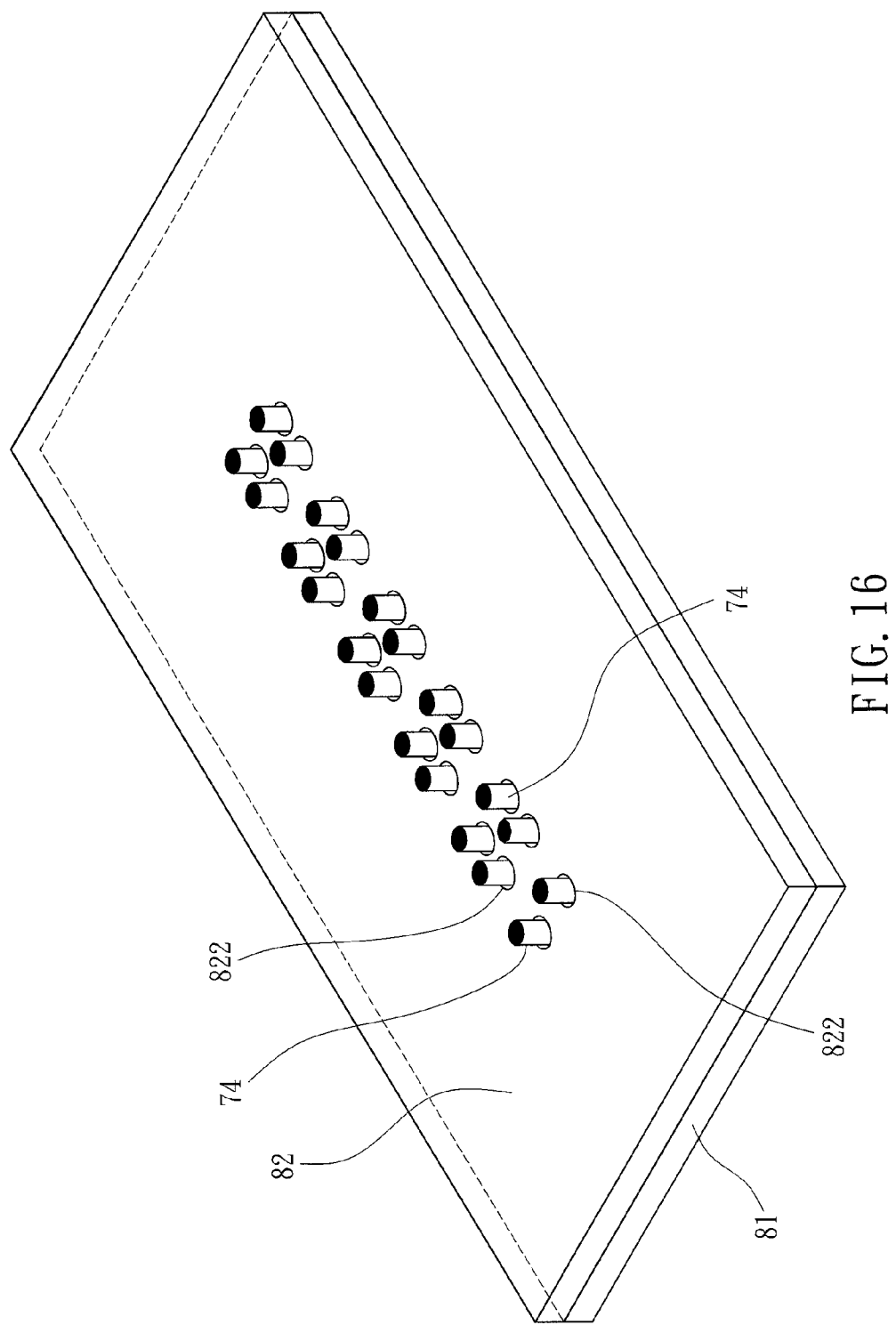
FIG. 16 is a perspective view of the probe needles and the first and second positioning films of the vertical probe device according to the eighth preferred embodiment of the present invention, showing the status that the needle heads of the probe needles haven't been positioned perfectly by the first and second positioning films.
Figure 17:
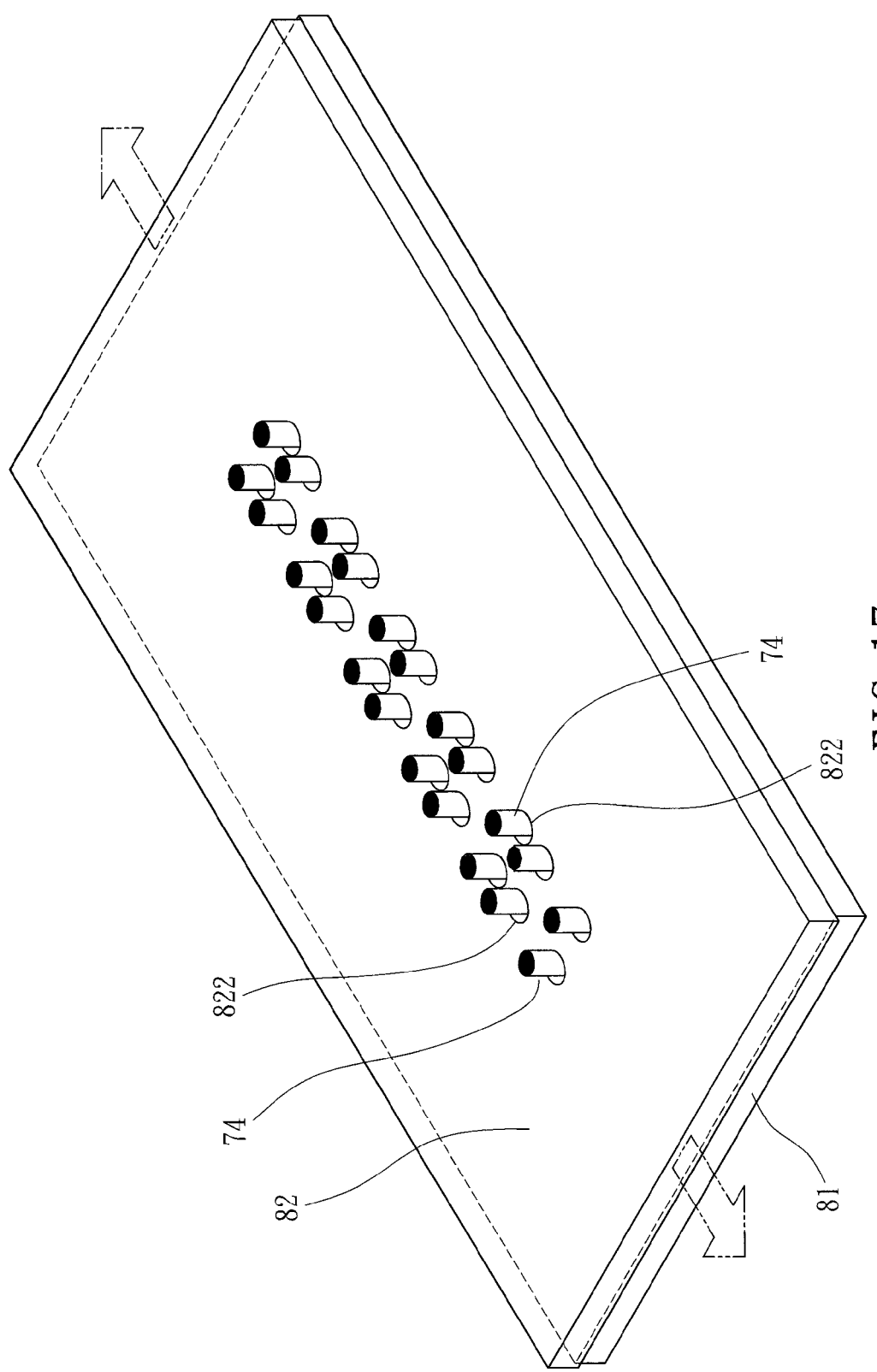
FIG. 17 is a perspective view of the probe needles and the first and second positioning films of the vertical probe device according to the eighth preferred embodiment of the present invention, showing the status that the needle heads of the probe needles have been positioned perfectly by the first and second positioning films.

Referring to FIGS. 15-17, in a vertical probe device 15 according to an eighth preferred embodiment of the present invention, the needle heads 74 of the probe needles 70 are positioned by a first positioning film 81 and a second positioning film 82. The vertical probe device 15 also has the aforesaid upper and lower dies 60, 20, but the upper and lower dies 60, 20 in this embodiment are not shown in the figures for the convenience of illustration. The first positioning film 81 is disposed between the upper and lower dies 60, 20 and has a plurality of first positioning holes 812. The second positioning film 82 is disposed between the first positioning film 81 and the upper die 60 and has a plurality of second positioning holes 822. The needle head 74 of each of the probe needles 70 is inserted through one of the first positioning holes 812 and one of the second positioning holes 822.

As shown in FIG. 15, only one single needle head 74 is inserted through each of the first and second positioning holes 812, 822, and the first and second positioning holes 812, 822 passed through by the same needle head 74 are substantially deviated from the needle head 74 inserted therein toward two opposite directions along an imaginary straight line L. In FIG. 15, each first positioning hole 812 is deviated to the right from the needle head 74 inserted therein, and each second positioning hole 822 is deviated to the left from the needle head 74 inserted therein. Besides, each of the first and second positioning holes 812, 822 is defined with a length D1 in the direction parallel to the imaginary straight line L, and each needle head 74 is defined with a length D2 in the direction parallel to the imaginary straight line L; the ratio of the length D1 to the length D2 is larger than or equal to 1.5 and smaller than 2. In other words, the length D1 of each of the first and second positioning holes 812, 822 is at least 1.5 times of the diameter of the needle head 74, i.e. the length D2, but less than 2 times of the diameter of the needle head 74. Therefore, each of the first and second positioning holes 812, 822 is unable to accommodate two needle heads 74, but facilitates the probe needle to be inserted therein easily. Each of the first and second positioning holes 812, 822 may, but not limited to, be shaped as an ellipse, the length of the major axis of which is defined as the aforesaid length D1. Each of the needle heads 74 may, but not limited to, have circular cross sections, the diameter of which is defined as the aforesaid length D2.

The first positioning film 81 and the second positioning film 82 may be identical in configuration. In the process of installation of the probe needles, the first and second positioning films 81, 82 may be piled on one another and aligned with each other as shown in FIG. 16, so that the second positioning holes 822 are exactly superposed on the first positioning holes 812 respectively. At this time, the installation of the probe needles can be performed easily because the length D1 of each of the first and second positioning holes 812, 822 is at least 1.5 times of the diameter of the probe needle. After the installation of the probe needles is accomplished, the first positioning holes 812 and the second positioning holes 822 can be set in a stagger manner by an easy way that the first and second positioning films 81, 82 are pulled and displaced toward opposite directions as shown in FIG. 17. As a result, the first and second positioning holes 812, 822 are deviated from each other as shown in FIG. 15, thereby positioning the needle heads 74 at desired positions. After that, the aforesaid upper positioning film 50 may be used to be disposed on the second positioning film 82 for positioning the needles heads 74 more precisely. Alternately, the upper die 60 may be directly disposed above the second positioning film 82 without using such upper positioning film 50.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A vertical probe device comprising:
   a lower die having a plurality of lower installing holes;
   an upper die having a plurality of upper installing holes;
   a plurality of probe needles, each of which has a needle tail individually inserted through one of the lower installing holes, and a needle head individually inserted through one of the upper installing holes;
   a lower positioning film disposed between the lower die and the upper die and having a plurality of lower positioning holes, the needle head of each of the probe needles being inserted through one of the lower positioning holes, each of the lower positioning holes being capable of accommodating a plurality of said needle heads; and
   a dividing film disposed between the lower positioning film and the upper die and having a plurality of through holes and a plurality of dividing ribs, each of the dividing ribs being located between two of the through holes, each of the lower positioning holes of the lower positioning film being located under at least one of the dividing ribs, the needle head of each of the probe needles being inserted through one of the through holes of the dividing film.

2. The vertical probe device as claimed in claim 1, wherein the lower positioning holes of the lower positioning film are aligned along at least one imaginary straight line; each of the lower positioning holes is capable of accommodating a plurality of said needle heads aligned along said at least one imaginary straight line.

3. The vertical probe device as claimed in claim 2, wherein each of the lower positioning holes has an elongated shape to limit the needle heads located therein to be aligned along only one said imaginary straight line.

4. The vertical probe device as claimed in claim 2, wherein the dividing film is a middle positioning film having a plurality of middle positioning holes serving as the through holes of the dividing film; each of the middle positioning holes and the lower positioning holes is defined with a length in a direction parallel to said at least one imaginary straight line, and the length of each of the middle positioning holes is smaller than or equal to the length of each of the lower positioning holes.

5. The vertical probe device as claimed in claim 4, wherein the needle head of each of the probe needles is provided at a top thereof with two chamferings.

6. The vertical probe device as claimed in claim 4, further comprising an upper positioning film having a plurality of upper positioning holes; wherein the middle positioning film is disposed between the upper positioning film and the lower positioning film, the needle head of each of the probe needles is inserted through one of the upper positioning holes, and each of the upper positioning holes is capable of accommodating only one said needle head.

7. The vertical probe device as claimed in claim 6, wherein each of the upper positioning holes is substantially equal in size to each of the upper installing holes or smaller than each of the upper installing holes.

8. The vertical probe device as claimed in claim 4, wherein at least one or more of the middle positioning holes have an elongated shape; each of the elongated middle positioning holes is capable of accommodating a plurality of said needle heads and limiting the needle heads located therein to be aligned in only one line.

9. The vertical probe device as claimed in claim 8, wherein each of the lower positioning holes has an elongated shape to limit the needle heads located therein to be aligned along only one said imaginary straight line; at least one or more of the middle positioning holes are identical in shape and direction of alignment to the lower positioning holes and staggered in position with the lower positioning holes.

10. The vertical probe device as claimed in claim 9, wherein each of the lower positioning holes is divided into two single-probe-needle holes by one of the dividing ribs of the middle positioning film; each of the single-probe-needle holes is capable of accommodating only one said needle head.

11. The vertical probe device as claimed in claim 10, wherein each of the single-probe-needle holes and the upper installing holes is defined with a length in a direction parallel to said at least one imaginary straight line, and the length of each of the single-probe-needle holes is larger than the length of each of the upper installing holes.

12. The vertical probe device as claimed in claim 4, wherein each of the lower positioning holes is divided into a plurality of single-probe-needle holes by at least one of the dividing ribs of the middle positioning film; each of the single-probe-needle holes is capable of accommodating only one said needle head.

13. The vertical probe device as claimed in claim 12, wherein each of the single-probe-needle holes and the upper installing holes is defined with a length in a direction parallel to said at least one imaginary straight line, and the length of each of the single-probe-needle holes is larger than the length of each of the upper installing holes.

14. The vertical probe device as claimed in claim 1, wherein the dividing film is an upper positioning film having a plurality of upper positioning holes serving as the through holes of the dividing film; each of the upper positioning holes is capable of accommodating only one said needle head.

15. The vertical probe device as claimed in claim 14, wherein each of the upper positioning holes is substantially equal in size to each of the upper installing holes or smaller than each of the upper installing holes.

16. A vertical probe device comprising:
a lower die having a plurality of lower installing holes;
an upper die having a plurality of upper installing holes;
a plurality of probe needles, each of which has a needle tail individually inserted through one of the lower installing holes, and a needle head individually inserted through one of the upper installing holes;
a first positioning film disposed between the lower die and the upper die and having a plurality of first positioning holes, the needle head of each of the probe needles being inserted through one of the first positioning holes; and
a second positioning film disposed between the first positioning film and the upper die and having a plurality of second positioning holes, the needle head of each of the probe needles being inserted through one of the second positioning holes;
wherein the first positioning hole and the second positioning hole passed through by the same needle head are substantially deviated from the needle head inserted therethrough toward two opposite directions along an imaginary straight line; each of the first positioning holes, the second positioning holes and the needle heads is defined with a length in a direction parallel to the imaginary straight line, and the ratio of the length of each of the first positioning holes and the second positioning holes to the length of each of the needle heads is larger than or equal to 1.5 and smaller than 2.

17. The vertical probe device as claimed in claim 16, wherein the first positioning film and the second positioning film are identical in configuration to each other.

* * * * *